(12) United States Patent
Mehta

(10) Patent No.: US 7,897,448 B1
(45) Date of Patent: Mar. 1, 2011

(54) FORMATION OF HIGH VOLTAGE TRANSISTOR WITH HIGH BREAKDOWN VOLTAGE

(75) Inventor: Sunil Mehta, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 326 days.

(21) Appl. No.: 12/122,489

(22) Filed: May 16, 2008

Related U.S. Application Data

(62) Division of application No. 11/487,663, filed on Jul. 17, 2006, now abandoned.

(51) Int. Cl.
   *H01L 21/336* (2006.01)
(52) U.S. Cl. .................. 438/201; 438/593; 257/E21.209
(58) Field of Classification Search .................. 438/201, 438/211, 257, 593; 257/E21.209
   See application file for complete search history.

(56) References Cited

U.S. PATENT DOCUMENTS

2007/0020839 A1\* 1/2007 Sridhar et al. ................ 438/199

\* cited by examiner

*Primary Examiner* — Thanhha Pham

(57) ABSTRACT

A high voltage transistor exhibiting an improved breakdown voltage and related methods are provided. For example, a method of manufacturing an integrated circuit includes etching a poly silicon layer to provide a gate stacked above a floating gate of a flash memory cell. A source and a drain of the flash memory cell are implanted in a substrate. The poly silicon layer is etched to provide a gate of a high voltage transistor. Lightly doped drain (LDD) implants are provided in source/drain regions of the high voltage transistor in the substrate. An annealing operation is performed on the integrated circuit, wherein the annealing causes each of the LDD implants to form a graded junction in relation to a channel in the substrate between the LDD regions, and further causes sidewalls to oxidize on the gates of the flash memory cell and on the gate of the high voltage transistor.

12 Claims, 3 Drawing Sheets

FORMATION OF HIGH VOLTAGE TRANSISTOR WITH HIGH BREAKDOWN VOLTAGE

RELATED APPLICATION DATA

This application is a divisional of U.S. application Ser. No. 11/487,663, filed Jul. 17, 2006.

TECHNICAL FIELD

The present invention relates generally to integrated circuits and, more particularly, to the manufacture of high voltage transistors.

BACKGROUND

Programmable logic devices (PLDs), such as field programmable gate arrays (FPGAs) or complex programmable logic devices (CPLDs), may include non-volatile memory (for example, flash memory) and volatile memory (for example, volatile SRAM memory) implemented in a single integrated circuit. Flash memory cells of the PLD may be programmed with configuration data to be downloaded into volatile SRAM cells to determine the user-defined functionality of the PLD.

The flash memory cells typically require programming voltages in a range of approximately 9.5 V to 10 V. Such programming voltages are substantially higher than typical operating voltages of volatile memory or other logic transistors of the PLD which may, for example, operate in a range of approximately 1.2 V to 3.3 V. As a result, PLDs may further include high voltage transistors to accommodate flash memory cell programming voltages.

However, in advanced integrated circuits having feature sizes of approximately 130 nm and smaller, individual high voltage transistors may be unable to sustain the voltages required for programming flash memory cells. In particular, high voltage transistors in such implementations may exhibit a relatively low breakdown voltage (for example, in the range of approximately 5 V to 8 V). As a result, the high voltage transistors may be implemented in a cascode configuration, with the programming voltages being distributed across a plurality of high voltage transistors (for example, a 10 V programming voltage with 5 V distributed across two high voltage transistors).

Unfortunately, cascoded high voltage transistors typically occupy a large die area. Consequently, the peripheral circuitry required to program a flash memory cell array in such implementations can be significantly larger than the flash memory cell array itself. This disparity can result in a very low array efficiency in the PLD.

The low breakdown voltage exhibited by certain high voltage transistors can be attributed to abrupt junctions between lightly doped drain (LDD) regions and channels of the high voltage transistors. These abrupt junctions are caused by tight thermal budget requirements imposed by conventional manufacturing processes for integrated circuits having flash memory cells, high voltage transistors, and low voltage transistors on a shared die. Typically, the shallower source/drain regions of low voltage transistors cannot sustain the high temperatures applied in annealing operations used in the formation of flash memory cells. As a result, flash memory cells are typically formed first, followed by the simultaneous formation of the high and low voltage transistors.

In this regard, a stacked gate structure of the flash memory cell may be formed, followed by implantation of source/drain regions of the flash memory cell. Thermal annealing is then performed to oxidize sidewalls of the stacked gate structure at temperatures of approximately 900 degrees C. Thereafter, gates of the high voltage and low voltage transistors may be etched, and LDD regions of the high and low voltage transistors may be implanted, causing abrupt junctions to be formed between the LDD regions and channels of the transistors. As previously explained, the abrupt junctions formed in the high voltage transistors can result in a low breakdown voltage which necessitates the use of plural high voltage transistors in a cascode configuration to support programming voltages of the flash memory cells.

In view of the foregoing, there is a need for an improved approach to the formation of high voltage transistors that may individually support appropriate programming voltages of flash memory cells on a shared die without requiring cascoding of the high voltage transistors. In addition, there is a need to provide such transistors while still permitting the formation of low voltage logic transistors on the shared die.

SUMMARY

In accordance with one embodiment of the present invention, a method of manufacturing an integrated circuit includes forming a flash memory cell on a substrate, the cell having a gate stacked above a floating gate; forming a high voltage transistor on the substrate, the transistor having a gate and source/drain regions; providing lightly doped drain (LDD) implants in source/drain regions of the high voltage transistor in the substrate; and annealing the integrated circuit, wherein the annealing is sufficient to concurrently cause each of the LDD implants to form a graded junction in relation to a channel in the substrate between the LDD regions, oxidized sidewalls to form on the gates of the flash memory cell, and oxidized sidewalls to form on the gate of the high voltage transistor.

In accordance with another embodiment of the present invention, a method of manufacturing an integrated circuit includes etching a poly silicon layer to provide a gate stacked above a floating gate of a flash memory cell; implanting a source and a drain of the flash memory cell in a substrate; etching the poly silicon layer to provide a gate of a high voltage transistor; providing lightly doped drain (LDD) implants in source/drain regions of the high voltage transistor in the substrate; annealing the integrated circuit, wherein the annealing is sufficient to concurrently cause each of the LDD implants to form a graded junction in relation to a channel in the substrate between the LDD regions, oxidized sidewalls to form on the gates of the flash memory cell, and oxidized sidewalls to form on the gate of the high voltage transistor; and providing LDD implants in source/drain regions of a low voltage transistor in the substrate.

In accordance with another embodiment of the present invention, a method of manufacturing an integrated circuit includes etching a poly silicon layer to provide a gate stacked above a floating gate of a flash memory cell and a gate of a high voltage transistor; implanting a source and a drain of the flash memory cell in a substrate; providing lightly doped drain (LDD) implants in source/drain regions of the high voltage transistor in the substrate; annealing the integrated circuit, wherein the annealing is sufficient to concurrently cause each of the LDD implants to form a graded junction in relation to a channel in the substrate between the LDD regions; oxidized sidewalls to form on the gates of the flash memory cell, and oxidized sidewalls to form on the gate of the high voltage transistor; and providing LDD implants in source/drain regions of a low voltage transistor in the substrate.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

The various techniques disclosed herein are applicable to a wide variety of integrated circuits. As an exemplary implementation, a programmable logic device (PLD) will be utilized to illustrate the techniques in accordance with one or more embodiments of the present invention. However, it should be understood that this is not limiting and that the techniques disclosed herein may be implemented as desired, in accordance with one or more embodiments of the present invention, within various types of integrated circuits.

Figure 1:
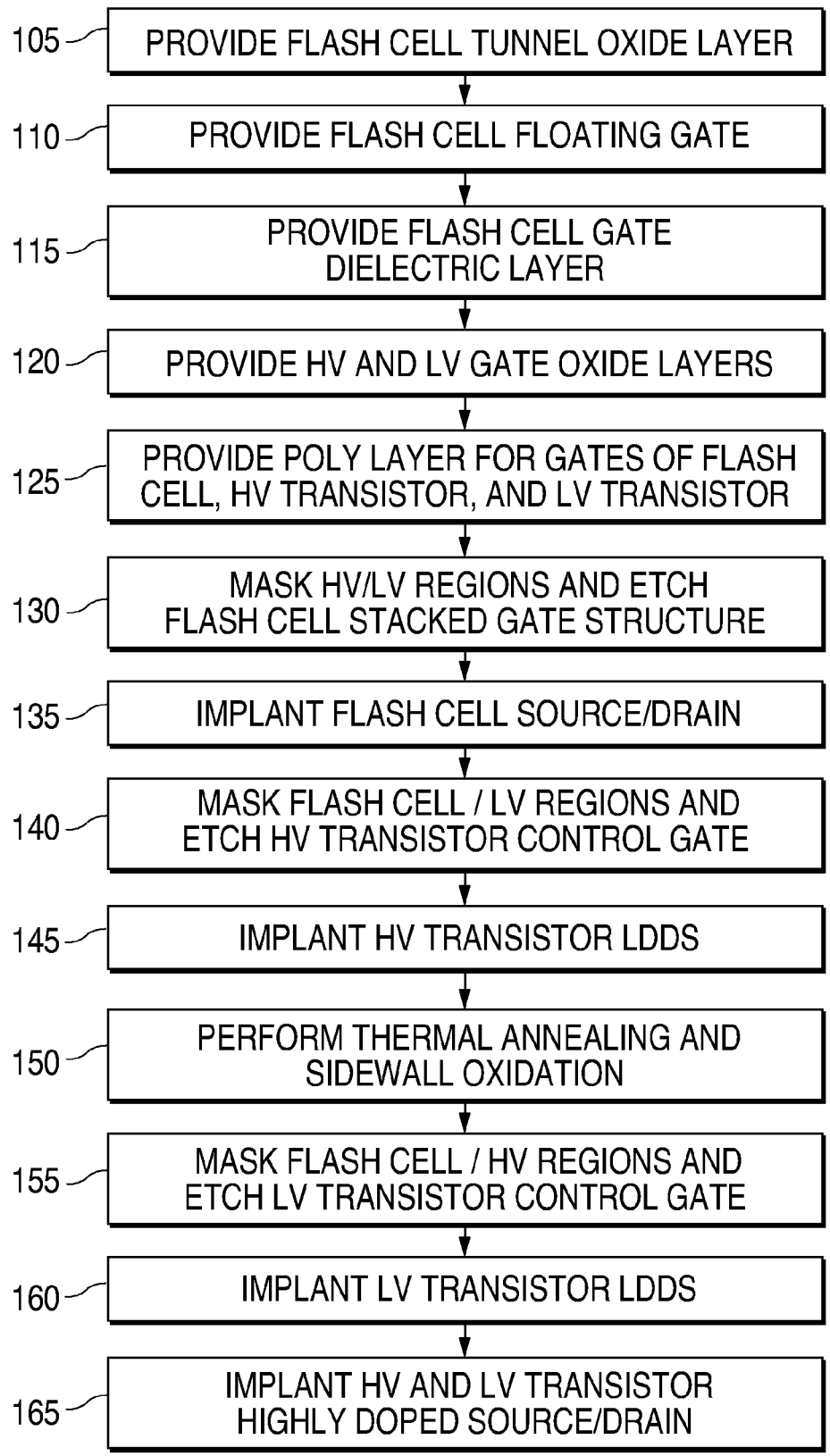
FIG. 1 illustrates a process of manufacturing a semiconductor device in accordance with an embodiment of the present invention.

FIG. 1 illustrates a process of manufacturing a semiconductor device in accordance with an embodiment of the present invention. As further described herein, the process of FIG. 1 can be performed to form flash memory cells, high voltage transistors, and low voltage transistors of a semiconductor device.

High voltage transistors formed in accordance with the various embodiments set forth herein can be configured to support programming voltages sufficient to program flash memory cells without requiring cascoding of the high voltage transistors. For example, in one embodiment, high voltage transistors formed in accordance with the process of FIG. 1 may exhibit a high breakdown voltage in excess of approximately 9.5 V, even when implemented in integrated circuits having nominal feature sizes of approximately 130 nm and smaller. It will be appreciated that such high voltage transistors may individually support sufficiently high voltages to facilitate programming of flash memory cells without requiring additional cascoded high voltage transistors.

FIGS. 2A-E illustrate cross-sectional side views of a semiconductor device 200 undergoing the process of FIG. 1 in accordance with an embodiment of the present invention. FIG. 3 illustrates a cross-sectional side view of semiconductor device 200 undergoing an alternate version of the process of FIG. 1 in accordance with an embodiment of the present invention. It will be appreciated that for purposes of clarity, the various aspects of semiconductor device 200 illustrated in FIGS. 2A-E and FIG. 3 are not drawn to scale.

Semiconductor device 200 may be implemented as any desired type of integrated circuit that includes one or more flash memory cells, high voltage transistors, and/or low voltage transistors. For example, in one embodiment, semiconductor device 200 may be implemented as a programmable logic device (PLD) such as a complex programmable logic device (CPLD) or a field programmable gate array (FPGA). Although individual transistor regions of FIGS. 2A-E and FIG. 3 will be further described herein, it will be appreciated that the process of FIG. 1 may be applied to the manufacture of large numbers of transistors configured in arrays or otherwise.

Figure 2A:
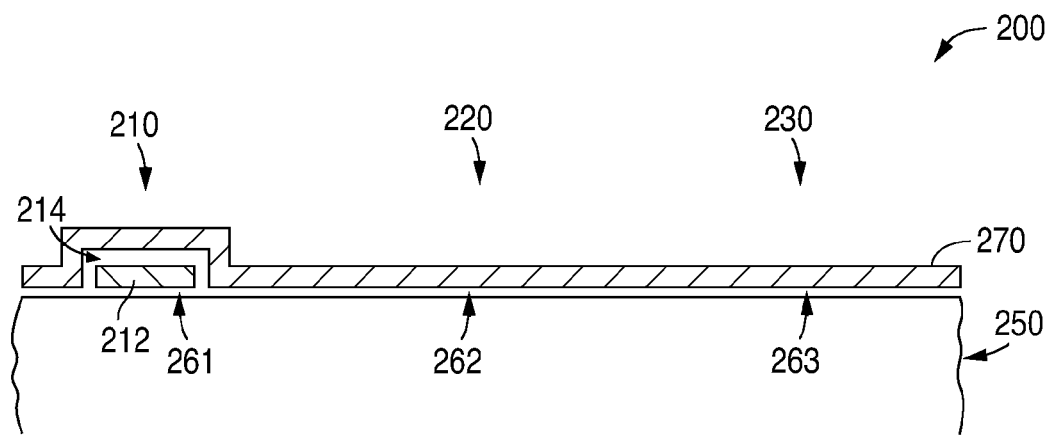
FIGS. 2A-E illustrate cross-sectional side views of a semiconductor device undergoing the process of FIG. 1 in accordance with an embodiment of the present invention.
Figure 3:
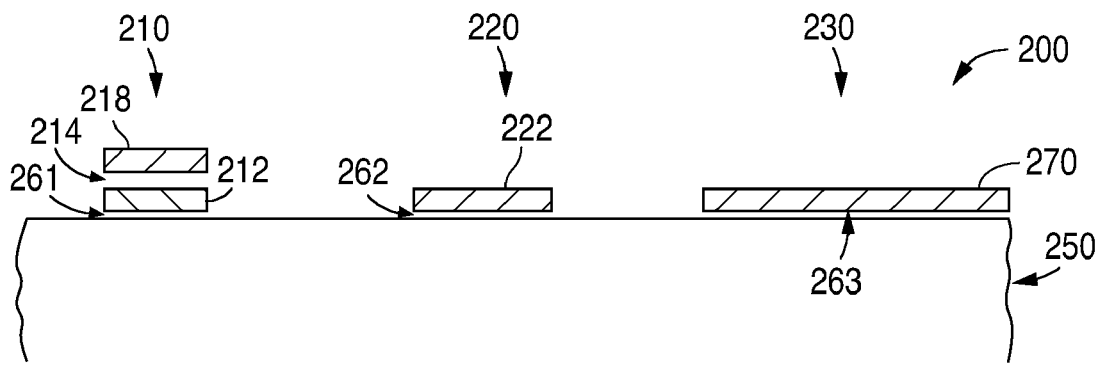
FIG. 3 illustrates a cross-sectional side view of a semiconductor device undergoing an alternate embodiment of the process of FIG. 1 in accordance with an embodiment of the present invention.

FIG. 2A illustrates semiconductor device 200 having undergone operations 105 through 125 of the process of FIG. 1. As illustrated, semiconductor device 200 includes a substrate 250 (for example, a p-type substrate or an n-type substrate) having a flash memory cell region 210, a high voltage transistor region 220, and a low voltage transistor region 230.

In operation 105, a tunnel oxide layer 261 is provided on substrate 250 in flash memory cell region 210 through conventional processing techniques. In one embodiment, tunnel oxide layer 261 may exhibit a thickness in a range of approximately 90 to 100 angstroms in flash memory cell region 210.

In operation 110, a floating gate 212 is provided in flash memory cell region 210 which may be implemented, for example, with a layer of poly silicon through conventional processing techniques. A gate dielectric layer 214 is provided on floating gate 212 (operation 115) through conventional processing techniques. In one embodiment, gate dielectric layer 214 may be implemented as a conventional oxide-nitride-oxide ("ONO") multi-layer structure having a nitride layer situated between upper and lower oxide layers.

In operation 120, a high voltage gate oxide layer 262 is provided in high voltage region 220, and a low voltage gate oxide layer 263 is provided in low voltage region 230. In this regard, a first oxide layer is grown in high voltage and low voltage regions 220 and 230, respectively. In one embodiment, the first oxide layer may exhibit a thickness of approximately 130 angstroms.

Also in operation 120, the first oxide layer may be etched away in low voltage region 220. A second oxide layer is then grown in high voltage region 220 (i.e., on top of the first oxide layer) and in low voltage region 230 (i.e., on top of substrate 250). In one embodiment, the second oxide layer may exhibit a thickness of approximately 20 angstroms. Accordingly, following operation 120, high voltage gate oxide layer 262 will be formed and may exhibit a thickness of approximately 150 angstroms in high voltage transistor region 220. In addition, low voltage gate oxide layer 263 will be formed and may exhibit a thickness of approximately 20 angstroms in low voltage transistor region 230.

In operation 125, a poly silicon layer 270 is provided on gate dielectric layer 214 in flash memory cell region 210, and on high voltage and low voltage gate oxide layers 262 and 263 in high and low voltage transistor regions 220 and 230, respectively, through conventional processing techniques. As further described herein, poly silicon layer 270 may be used in the formation of gates for transistors formed in flash memory cell region 210, high voltage transistor region 220, and low voltage transistor region 230.

Figure 2B:
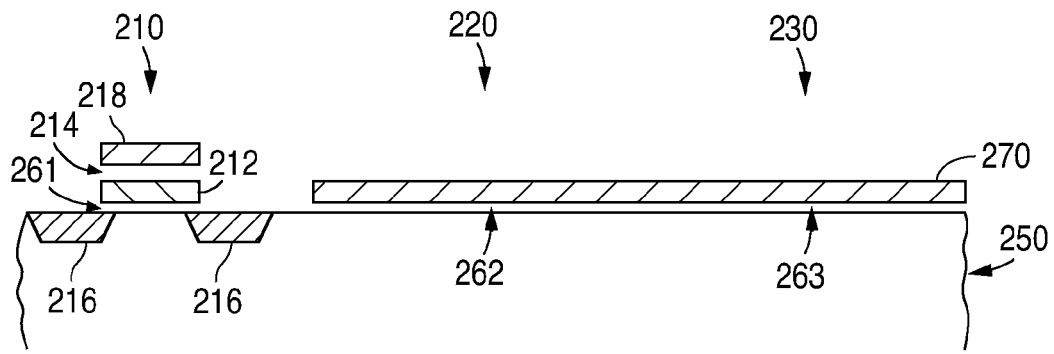

FIG. 2B illustrates semiconductor device 200 having undergone operations 130 through 135 of the process of FIG. 1. Specifically, in operation 130, high and low voltage transistor regions 220 and 230, respectively, are masked. Poly silicon layer 270 and tunnel oxide layer 261 are then etched in flash memory cell region 210 to reveal a stacked gate structure including tunnel oxide layer 261, floating gate 212, gate dielectric layer 214, and a control gate 218 (i.e., formed from poly silicon layer 270). Source/drain implants 216 are then provided in flash memory cell region 210 of substrate 250 (operation 135).

Figure 2C:
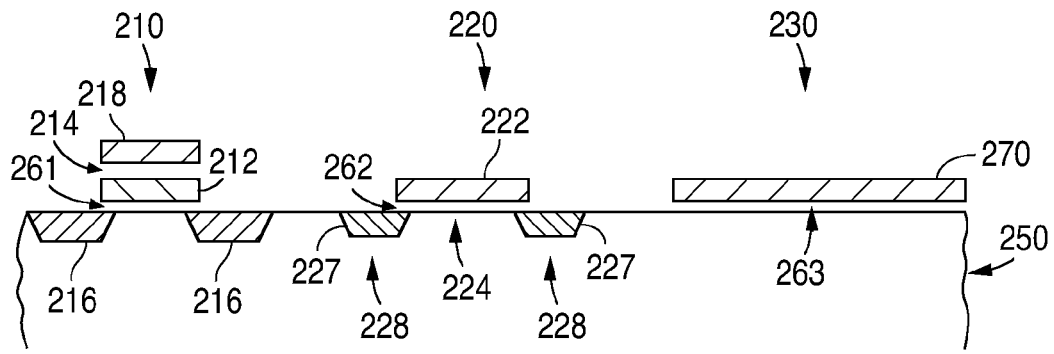

FIG. 2C illustrates semiconductor device 200 having undergone operations 140 through 145 of the process of FIG. 1. In operation 140, flash memory cell region 210 and low voltage transistor region 230 are masked. Poly silicon layer 270 and high voltage gate oxide layer 261 are then etched in high voltage transistor region 220 to reveal a gate 222 (i.e., formed from poly silicon layer 270) on the remaining portion of high voltage gate oxide layer 262. In operation 145, lightly doped drain (LDD) implants 227 are provided in source/drain regions 228 on either side of a channel 224 in substrate 250. In various embodiments, LDD implants 227 may be implemented with arsenic, phosphorus, or other appropriate dopants.

In an alternate embodiment of the process of FIG. 1, operation 140 may be combined with operation 130. Specifically, the etching of the stacked gate structure of flash memory cell region 210 and the etching of gate 222 in high voltage transistor region 220 may be performed in a single operation (i.e., concurrently) prior to the providing of source/drain implants 216 in operation 135.

For example, FIG. 3 illustrates a cross-sectional side view of semiconductor device 200 following the performance of a combined operation 130/140 and prior to the performance of operation 135. As shown in FIG. 3, poly silicon layer 270, tunnel oxide layer 261, and high voltage gate oxide layer 262 are etched to provide gates 218 and 222. It will be appreciated that the combining of operations 130 and 140 into a single operation may advantageously reduce the number of processing steps (e.g., etching and masking steps) associated with the manufacture of semiconductor device 200.

It will be appreciated that poly silicon layer 270 may exhibit a greater thickness in flash memory cell region 210 than in high voltage transistor region 220 (see FIG. 2A). Accordingly, it will be appreciated that where operations 130 and 140 are combined, a highly selective etch may be performed such that the portions of poly silicon layer 270 in flash memory cell region 210 and in high voltage transistor region 220 may be etched simultaneously without inadvertently etching substrate 250.

As previously described, high voltage gate oxide layer 262 may exhibit a greater thickness (for example, approximately 150 angstroms) than tunnel oxide layer 261 (for example, in the range of approximately 90 to 100 angstroms). It will be appreciated that the greater thickness of high voltage gate oxide layer 262 may at least partially offset a difference in thickness of poly silicon layer 270 between flash memory cell region 210 and high voltage transistor region 220. Such an offset may further facilitate the selective etching of poly silicon layer 270 where operations 130 and 140 are combined. Following the performance of combined operation 130/140 in the embodiment of FIG. 3, operations 135 and 145 may be performed in the manner previously described herein.

Turning again to the particular embodiment set forth in FIGS. 2A-E, FIG. 2D illustrates semiconductor device 200 having undergone operation 150 of the process of FIG. 1. In operation 150, thermal annealing and oxidation are performed on semiconductor device 200. It will be appreciated that the thermal annealing of semiconductor device 200 may oxidize sidewalls 215 and 225 in flash memory cell region 210 and high voltage transistor region 220, respectively. In one embodiment, operation 150 can be performed by introducing semiconductor device 200 to a furnace of approximately 900 degrees C.

Figure 2D:
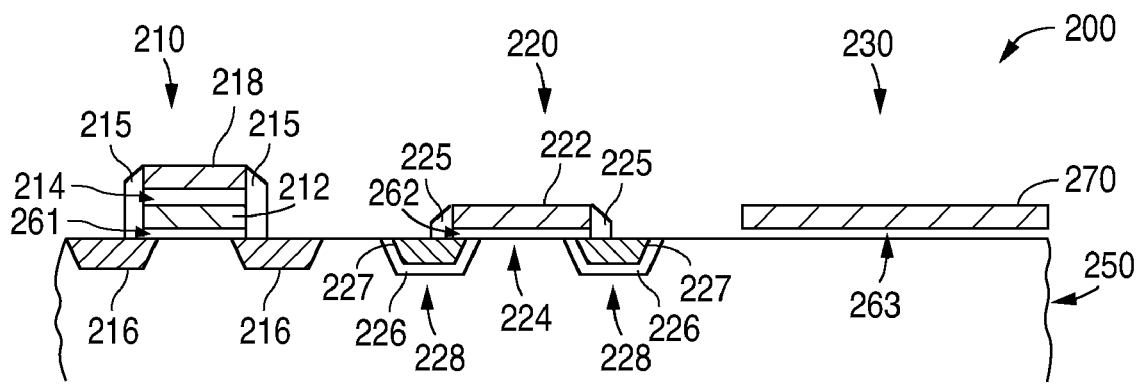

Advantageously, the annealing performed in operation 150 can cause the dopant of LDD implants 227 to diffuse into neighboring regions 226 of substrate 250 which consequently exhibit a lower dopant concentration than LDD implants 227. As illustrated in FIG. 2D, neighboring regions 226 may encroach into channel 224. As a result, the junction between channel 224 and LDD implants 227 is less abrupt than in prior art implementations previously described herein. A high voltage transistor exhibiting a graded junction in accordance with the embodiment illustrated in FIG. 2D may exhibit a breakdown voltage sufficiently high (for example, approximately 9.5 V or higher) to sustain voltages useful for programming a flash memory cell formed in flash memory cell region 210.

It will be appreciated that, in contrast to conventional semiconductor processing techniques, the annealing operation 150 of FIG. 1 is performed following the etching of gate 222 in operation 140 and also after the providing of LDD implants 227 in operation 145. This particular order of operations permits the formation of the graded junctions between LDD implants 227 and channel 224, while simultaneously forming sidewalls 215 and 225 in flash memory cell region 210 and high voltage transistor region 220, respectively.

Figure 2E:
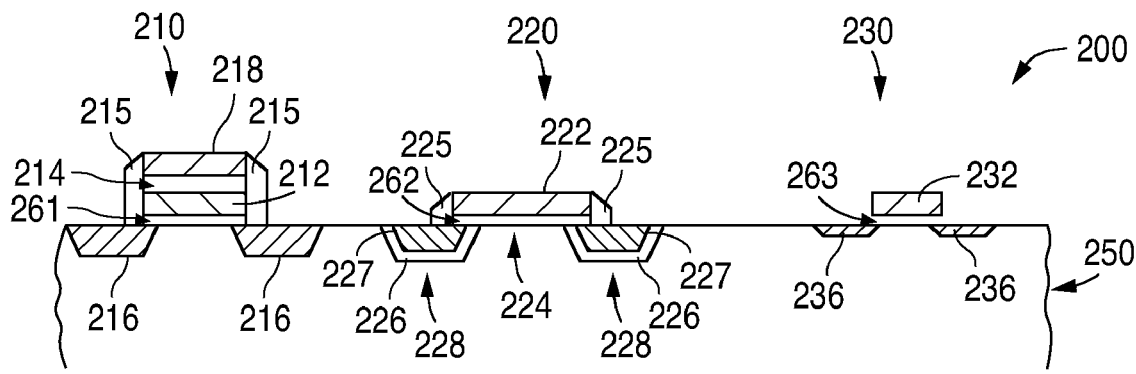

FIG. 2E illustrates semiconductor device 200 having undergone operations 155 through 160 of the process of FIG. 1. In operation 155, flash memory cell region 210 and high voltage transistor region 220 are masked. Poly silicon layer 270 and low voltage gate oxide layer 263 are then etched in low voltage transistor region 230 to reveal a gate 232 (i.e., formed from poly silicon layer 270) on the remaining portion of low voltage gate oxide layer 263. In operation 160, LDD implants 236 are provided (for example, through a "halo" or "pocket" implant) in substrate 250 in low voltage transistor region 230. In various embodiments, LDD implants 236 may be implemented with arsenic, phosphorus, or other appropriate dopants. As illustrated in FIG. 2E, LDD implants 236 may be shallower than LDD implants 226 of high voltage transistor region 220.

It will be appreciated that by providing LDD implants 236 after annealing operation 150, they are not exposed to the high temperatures of annealing operation 150. As a result, thermal deformation of LDD implants 236 can be prevented while still permitting LDD implants 227 of the high voltage transistor to form a graded junction during annealing operation 150.

In operation 165, source/drain implants (not shown) having a dopant concentration higher than LDD implants 227 may be provided in source/drain regions 228 adjacent to LDD implants 227 and 236, respectively, to complete the source/drain structure of the high voltage transistor. As will be understood by those skilled in the art, the manufacture of semiconductor 200 may include additional conventional processing operations not shown in FIG. 1. For example, following the process of FIG. 1, various conventional processing operations may be performed to complete the manufacture of transistors in flash memory cell region 210, high voltage transistor region 220, and low voltage transistor region 230.

In view of the present disclosure, it will be appreciated that various embodiments of the present invention provide improved approaches to the formation of integrated circuits having flash memory cells, high voltage transistors, and low voltage transistors on a common substrate. In particular, LDD implants 227 and 236 of the high and low transistors may be provided before and after annealing operation 150, respectively. As a result, the thermal budget used to form the flash memory cell during annealing operation 150 can be applied to the formation of a graded junction between LDD implants 226 and channel 224 of the high voltage transistor. The graded junction permits the high voltage transistor to exhibit a significantly higher breakdown voltage (for example, approximately 9.5 V or higher) in integrated circuits having a nominal feature size less than approximately 130 nm, thereby enabling the use of single high voltage transistors rather than plural cascoded transistors. Such an implementation permits a significant reduction of the area of peripheral programming circuitry for a given integrated circuit or PLD.

Embodiments described above illustrate but do not limit the invention. It should also be understood that numerous modifications and variations are possible in accordance with the principles of the present invention. Accordingly, the scope of the invention is defined only by the following claims.

I claim:

1. A method of manufacturing an integrated circuit, the method comprising:
    forming a flash memory cell on a substrate, the flash memory cell having a gate stacked above a floating gate;
    forming a high voltage transistor on the substrate, the high voltage transistor having a gate and source/drain regions;
    providing lightly doped drain (LDD) implants in the source/drain regions of the high voltage transistor in the substrate; and
    annealing the integrated circuit, wherein the annealing is sufficient to concurrently cause:
        each of the LDD implants to form a graded junction in relation to a channel in the substrate between the source/drain regions;
        oxidized sidewalls to form on the gate of the flash memory cell, and
        oxidized sidewalls to form on the gate of the high voltage transistor.

2. The method of claim 1, wherein forming the flash memory cell on a substrate comprises:
    etching a poly silicon layer to provide the gate stacked above the floating gate of the flash memory cell; and
    implanting a source and a drain of the flash memory cell in the substrate.

3. The method of claim 1, wherein forming the high voltage transistor on the substrate comprises etching a poly silicon layer to provide the gate of the high voltage transistor.

4. The method of claim 1, wherein the high voltage transistor is adapted to sustain a programming voltage provided to the flash memory cell.

5. The method of claim 1, wherein the high voltage transistor is adapted to sustain a programming voltage greater than approximately 9.5 volts provided to the flash memory cell.

6. The method of claim 1, wherein the annealing comprises heating the integrated circuit to approximately 900 degrees C.

7. The method of claim 1, further comprising implanting a source and a drain of the high voltage transistor adjacent to the LDD implants in the source/drain regions, wherein the source and drain of the high voltage transistor have a dopant concentration higher than the LDD implants.

8. The method of claim 1, further comprising after annealing the integrated circuit, providing LDD implants in source/drain regions of a low voltage transistor in the substrate.

9. The method of claim 1, wherein the integrated circuit has a nominal feature size less than approximately 130 nm.

10. The method of claim 1, wherein the integrated circuit is a programmable logic device.

11. A method of manufacturing an integrated circuit, the method comprising in order:
    etching a poly silicon layer to provide a gate stacked above a floating gate of a flash memory cell;
    implanting a source and a drain of the flash memory cell in a substrate;
    etching the poly silicon layer to provide a gate of a high voltage transistor;
    providing lightly doped drain (LDD) implants in source/drain regions of the high voltage transistor in the substrate;
    annealing the integrated circuit, wherein the annealing is sufficient to concurrently cause:
        each of the LDD implants to form a graded junction in relation to a channel in the substrate between the source/drain regions;
        oxidized sidewalls to form on the gate of the flash memory cell, and
        oxidized sidewalls to form on the gate of the high voltage transistor; and
    providing LDD implants in source/drain regions of a low voltage transistor in the substrate.

12. A method of manufacturing an integrated circuit, the method comprising in order:
    etching a poly silicon layer to provide a gate stacked above a floating gate of a flash memory cell and a gate of a high voltage transistor;
    implanting a source and a drain of the flash memory cell in a substrate;
    providing lightly doped drain (LDD) implants in source/drain regions of the high voltage transistor in the substrate;
    annealing the integrated circuit, wherein the annealing is sufficient to concurrently cause:
        each of the LDD implants to form a graded junction in relation to a channel in the substrate between the source/drain regions;
        oxidized sidewalls to form on the gate of the flash memory cell, and
        oxidized sidewalls to form on the gate of the high voltage transistor; and
    providing LDD implants in source/drain regions of a low voltage transistor in the substrate.

* * * * *